un10739385B2

United States Patent
Fukuhara et al.

(10) Patent No.: US 10,739,385 B2
(45) Date of Patent: Aug. 11, 2020

(54) MAGNETIC PERMEABLE MEMBER AND CURRENT DETECTION DEVICE

(71) Applicant: Yazaki Corporation, Tokyo (JP)

(72) Inventors: Toshiaki Fukuhara, Makinohara (JP); Makoto Sei, Makinohara (JP)

(73) Assignee: YAZAKI CORPORATION, Minato-ku, Tokyo (JP)

( * ) Notice: Subject to any disclaimer, the term of this patent is extended or adjusted under 35 U.S.C. 154(b) by 188 days.

(21) Appl. No.: 16/001,414

(22) Filed: Jun. 6, 2018

(65) Prior Publication Data

US 2019/0018047 A1 Jan. 17, 2019

(30) Foreign Application Priority Data

Jul. 14, 2017 (JP) ................................. 2017-138173

(51) Int. Cl.
*G01R 19/15* (2006.01)
*G01R 15/20* (2006.01)

(52) U.S. Cl.
CPC ........... *G01R 19/15* (2013.01); *G01R 15/207* (2013.01); *G01R 15/202* (2013.01)

(58) Field of Classification Search
None
See application file for complete search history.

(56) References Cited

U.S. PATENT DOCUMENTS

| 2011/0148407 A1* | 6/2011 | Kawaguchi | G01R 15/207 |
| | | | 324/244 |
| 2015/0015241 A1* | 1/2015 | Tamura | G01R 33/091 |
| | | | 324/117 R |

FOREIGN PATENT DOCUMENTS

| JP | 2009-150653 A | 7/2009 |
| JP | 2010-127896 A | 6/2010 |

* cited by examiner

*Primary Examiner* — Douglas X Rodriguez
(74) *Attorney, Agent, or Firm* — Sughrue Mion, PLLC

(57) ABSTRACT

A magnetic permeable member and a current detection device which can detect current in a wide range by a magnetic field detection element at low cost are provided. A magnetic permeable member includes a closed portion and an opened portion. Thus, when the large current flows through a bus bar, the magnetic field is less likely to be strong at the opened portion, thus the large current is easily detectable by a magnetic field detection element arranged at the opened portion. When the small current flows through the bus bar, the magnetic field is more likely to be strong at the closed portion, thus the small current is easily detectable by a magnetic field detection element arranged at the closed portion. Consequently, the magnetic field detection elements can be commonalized to reduce the cost, while allowing the detection of the current in a wide range.

8 Claims, 6 Drawing Sheets

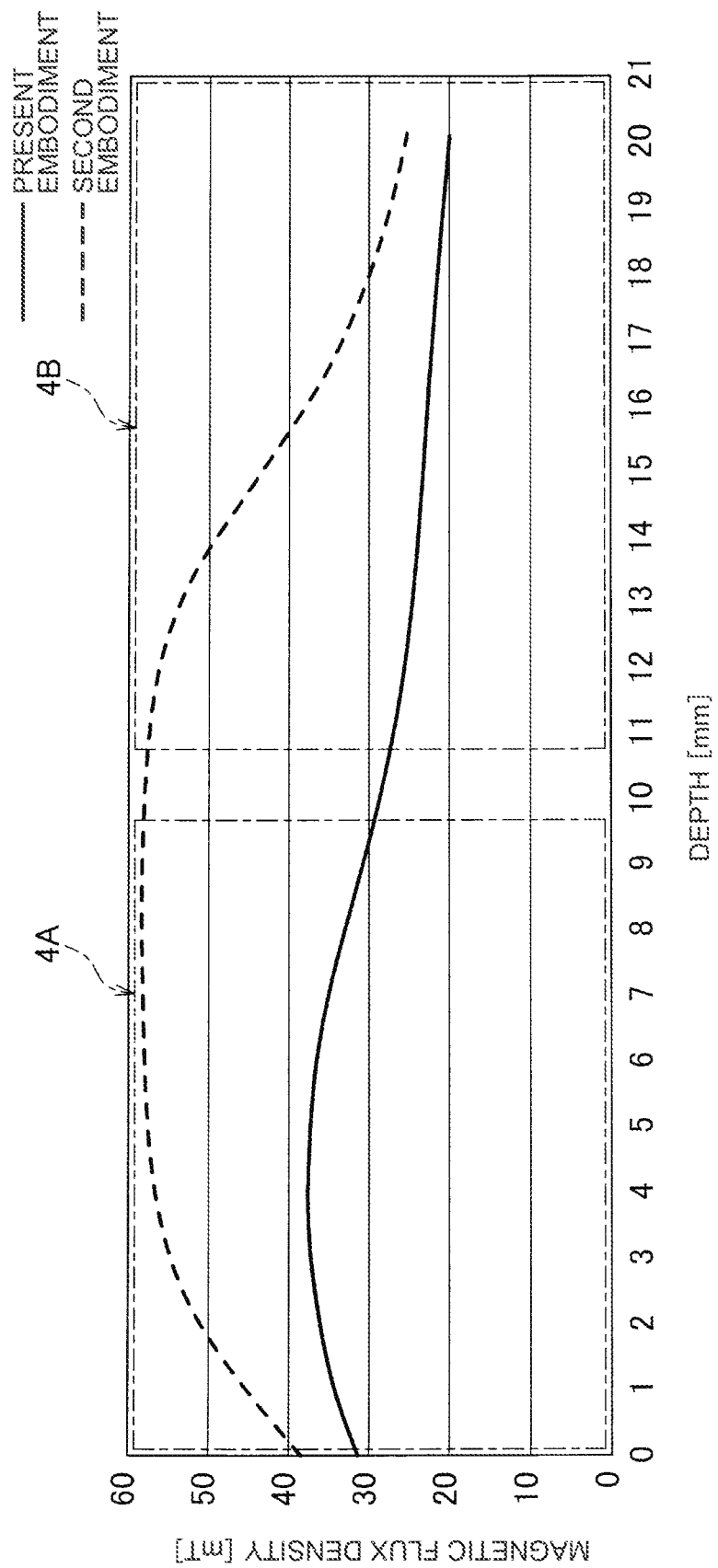

MAGNETIC PERMEABLE MEMBER AND CURRENT DETECTION DEVICE

CROSS REFERENCE TO RELATED APPLICATION

The priority application Japanese Patent Application No. 2017-138173 upon which this patent application is based is hereby incorporated by reference.

FIELD OF THE INVENTION

The present disclosure relates to a magnetic permeable member provided to a current detection device having a band plate-shaped bus bar and a plurality of magnetic field detection elements, and to the current detection device.

BACKGROUND OF THE INVENTION

In general, a vehicle is mounted with a power source such as a battery and an electric component such as a motor, and electric power is supplied from the power source to the electric component. Accordingly, a current detection device for detecting a current flowing between the power source and the electric component has been proposed, as disclosed in Japan Patent Application Publication No. 2010-127896 (hereinafter, "JP '896"), for example. A current detection device disclosed in JP '896 is provided with an electromagnetic shield frame member (magnetic permeable member) around a bus bar which electrically connects the power source to the electric component, such that when a current flows through the bus bar and a magnetic field is generated around the bus bar, the magnetic flux is allowed to pass through the electromagnetic shield frame member. Further, a Hall element (magnetic field detection element) is arranged at an appropriate position with respect to the electromagnetic shield frame member to detect the magnetic field using the Hall effect to detect the current flowing through the bus bar using the position of the Hall element and the detected magnetic field strength.

SUMMARY OF THE INVENTION

However, the Hall element such as the one disclosed in JP '896 has a limited range for the detectable magnetic field. That is, since the relative positions of the bus bar, the electromagnetic shield frame member and the Hall element are fixed, the magnetic field is detected when the current flowing through the bus bar is within the predetermined range, resulting in the detection of the current. Thus, if the value of the current flowing through the bus bar is largely changed, the strength of the generated magnetic field is also largely changed, thus a plurality of Hall elements is required to detect the current.

In this case, the current within the wide range can be detected by using the plurality of Hall elements having different detectable ranges of the magnetic field. However, the use of the plurality of Hall elements with different properties causes an increase in kinds of components of the current detection device, causing an increase in the cost. Aside from this, common plurality of Hall elements can be used, and they can be arranged at positions with different magnetic field intensities. That is, the Hall element can be arranged at a position at which the magnetic flux is less likely to pass through (e.g., a position distant from a bottom plate portion of the electromagnetic shield frame member having a U-shaped cross section) to detect a large current, while the Hall element can be arranged at a position through which the magnetic flux is more likely to pass (e.g., a position in the vicinity of the bottom plate portion of the electromagnetic shield frame member) to detect a small current. However, it is difficult to detect the current for a sufficiently wide range by simply adjusting the distance between the Hall element and the bottom plate portion.

An object of the present invention is to provide a magnetic permeable member and a current detection device which can detect a current in a wide range by a magnetic field detection element at low cost.

To achieve the above-mentioned object, the present invention provides a magnetic permeable member configured to be provided to a current detection device having a band plate-shaped bus bar and a plurality of magnetic field detection elements for detecting magnetic field generated by a current flowing through the bus bar, the magnetic permeable member including, a bottom plate portion arranged to face the bus bar, a pair of standing wall portions standing from the bottom plate portion and positioned on both widthwise sides of the bus bar, and a pair of facing plate portions extending toward each other, each of the pair of facing plate portions extending from a part in a lengthwise direction of the bus bar of an upper end of each of the pair of standing wall portions so as to face the bottom plate portion, wherein the bottom plate portion, the pair of standing wall portions and the pair of facing plate portions together constitute a closed portion having a C-shaped or O-shaped cross section, and the bottom plate portion and the pair of standing wall portions together constitute an opened portion having a U-shaped cross section, and the closed portion and the opened portion are arranged side by side along the lengthwise direction.

According to the magnetic permeable member of the present invention, the closed portion having the C-shaped or O-shaped cross section is configured into a ring-like shape (including a closed ring-like shape and an opened ring-like shape) with an axis extending in the direction along which the current passes (i.e., the lengthwise direction of the bus bar). Thus, when the current flows through the bus bar, the magnetic flux is more likely to pass through the closed portion. Consequently, the magnetic flux is likely to concentrate at the closed portion, and thus the magnetic field is likely to be strong inside the closed portion. On the other hand, at the U-shaped opened portion, the standing wall portions are spaced apart from each other and the magnetic resistance is large between them. Thus, the magnetic flux is less likely to pass compared to the closed portion. Consequently, compared to the closed portion, in the opened portion, the magnetic flux is less likely to be concentrated especially at a position distant from the bottom plate portion, and thus the magnetic field is less likely to be strong.

Consequently, when the large current flows through the bus bar, the magnetic field is less likely to be strong at the opened portion, thus the large current is easily detectable by the magnetic field detection element arranged in the opened portion. Further, when the small current flows through the bus bar, the magnetic field is more likely to be strong at the closed portion, thus the small current is easily detectable by the magnetic field detection element arranged in the closed portion. Thus, the wide range of the current can be detected with the use of the common magnetic field detection elements arranged respectively in the closed portion and the opened portion, thereby reducing the cost.

BRIEF DESCRIPTION OF THE DRAWINGS

FIG. 9 is a graph showing another positional dependency of a magnetic flux density in the magnetic permeable member.

DETAILED DESCRIPTION OF EXEMPLARY EMBODIMENT OF THE INVENTION

Figure 1:
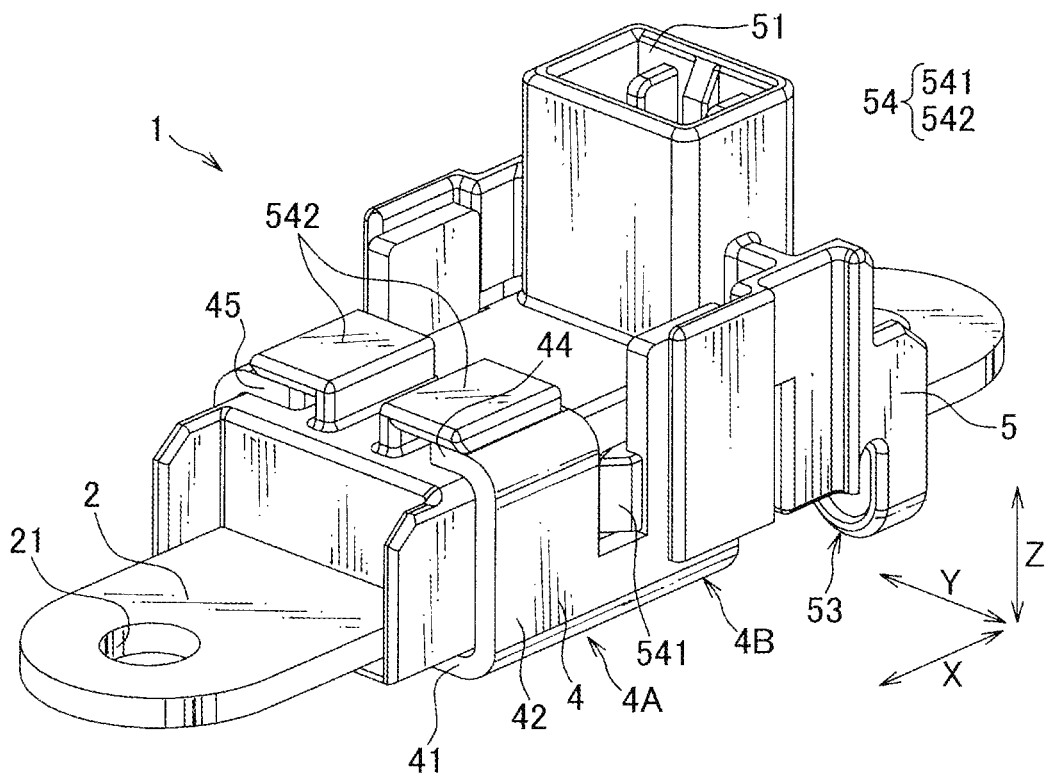
FIG. 1 is a perspective view showing a current detection device according to one embodiment of the present invention.
Figure 2:
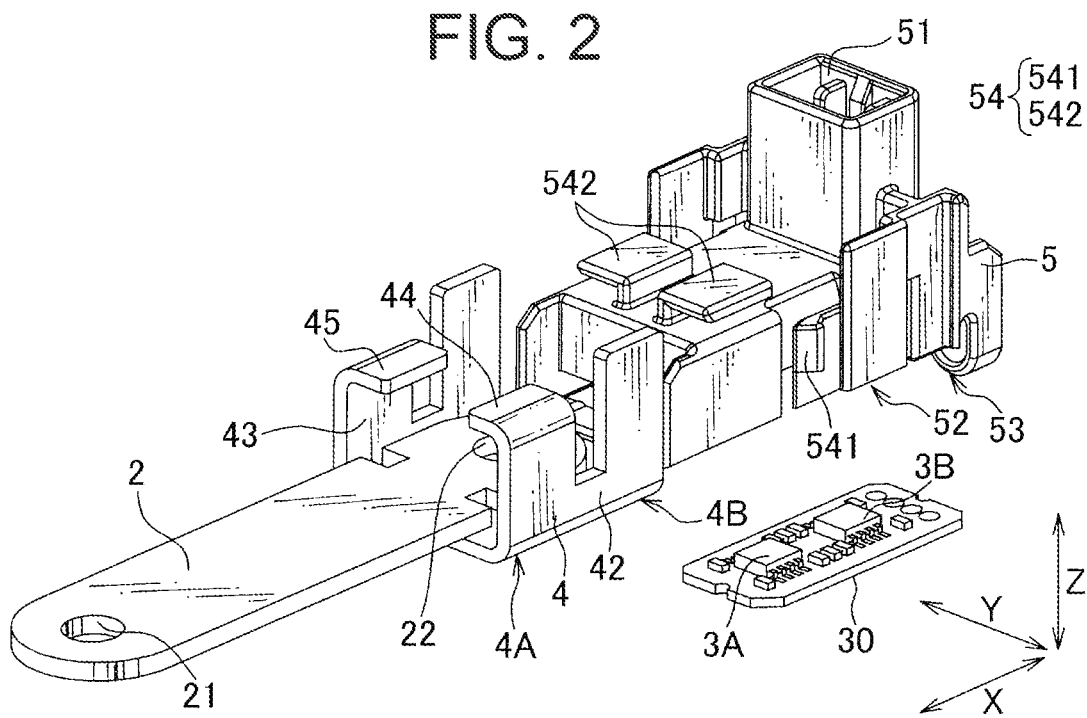
FIG. 2 is an exploded perspective view showing the current detection device.
Figure 3:
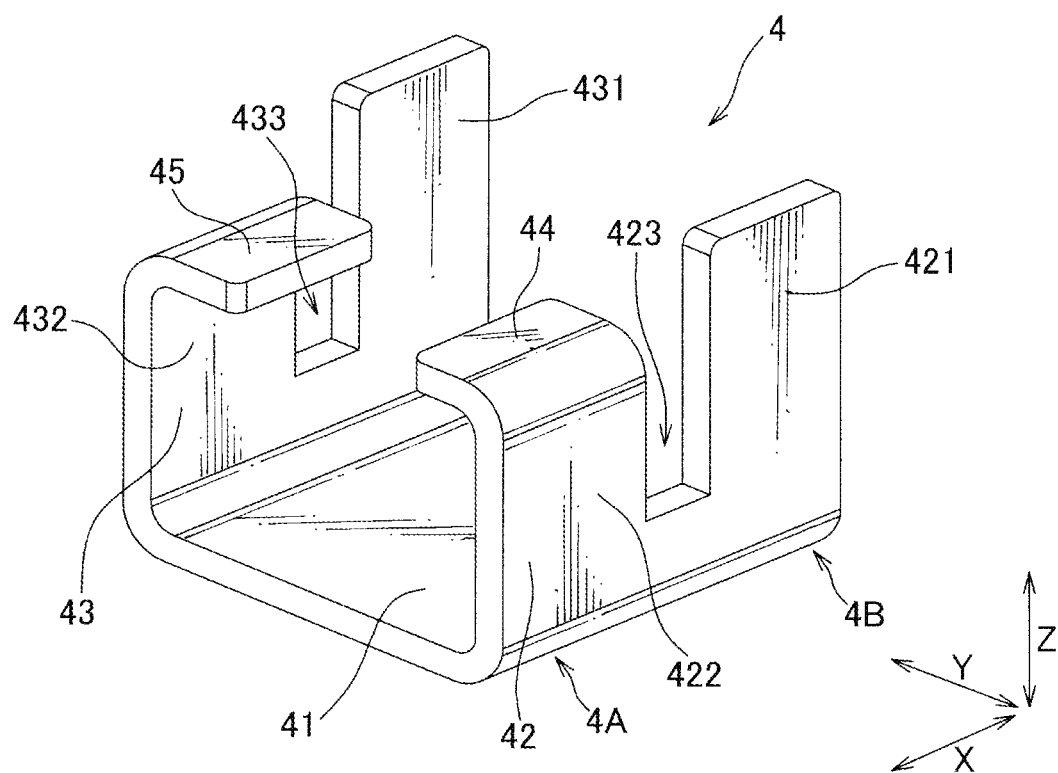
FIG. 3 is a perspective view showing a magnetic permeable member of the current detection device.
Figure 4:
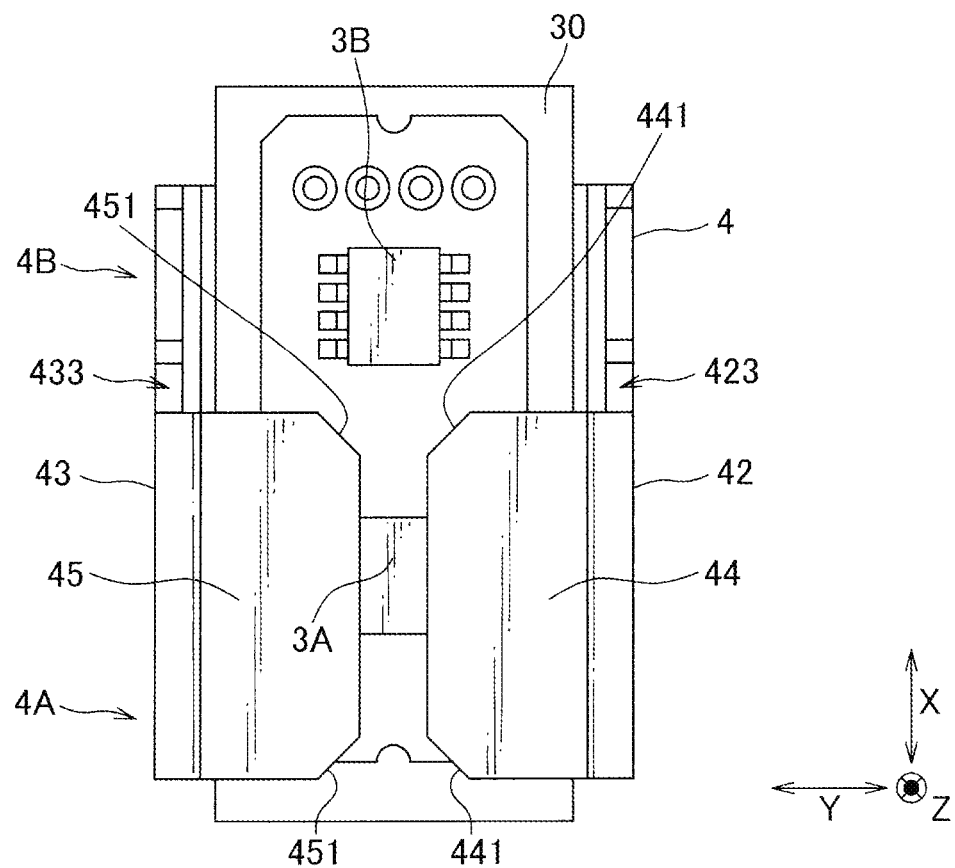
FIG. 4 is a top view showing a part of the current detection device.
Figure 5:
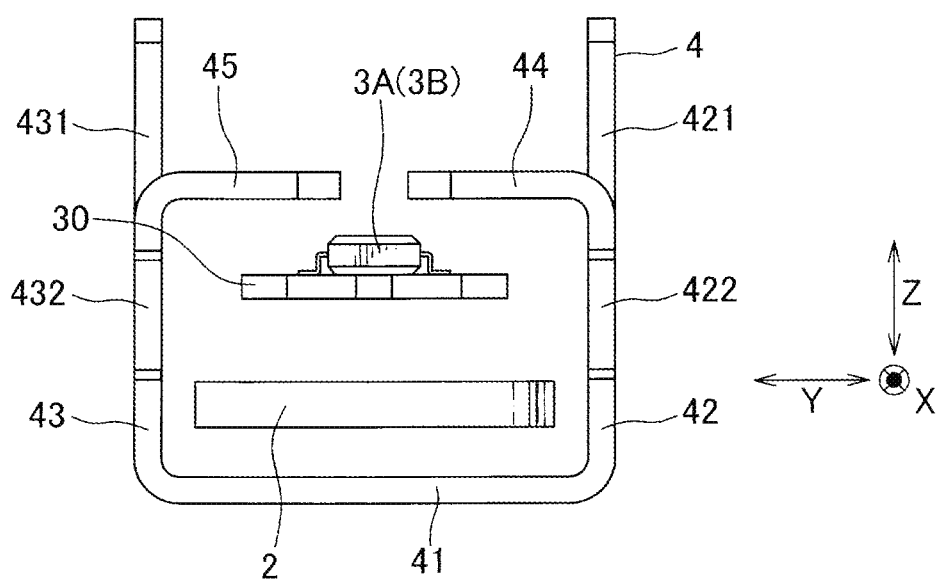
FIG. 5 is a front view showing a part of the current detection device.
Figure 6:
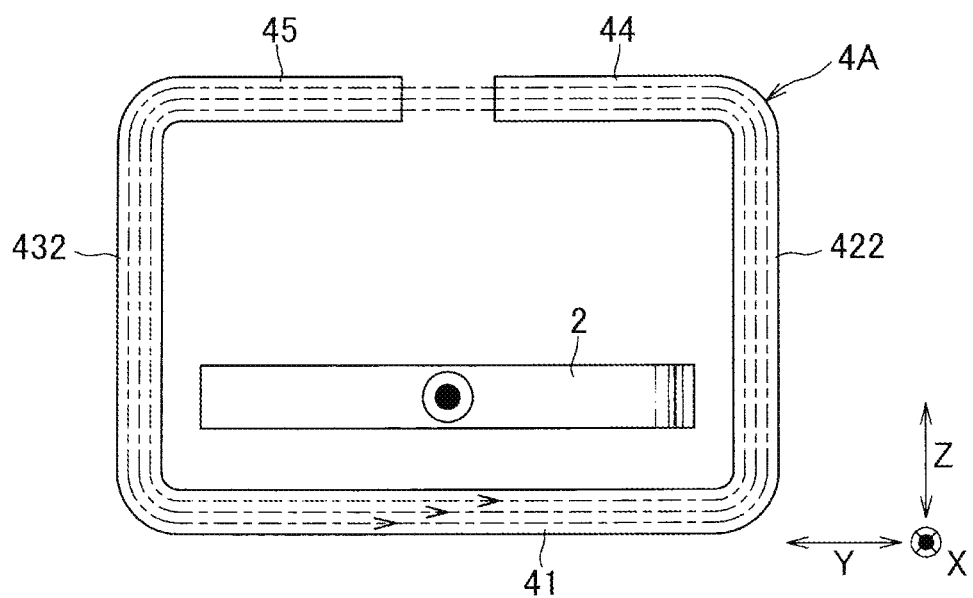
FIG. 6 is a front view illustrating a magnetic flux passing through a closed portion of the magnetic permeable member.
Figure 7:
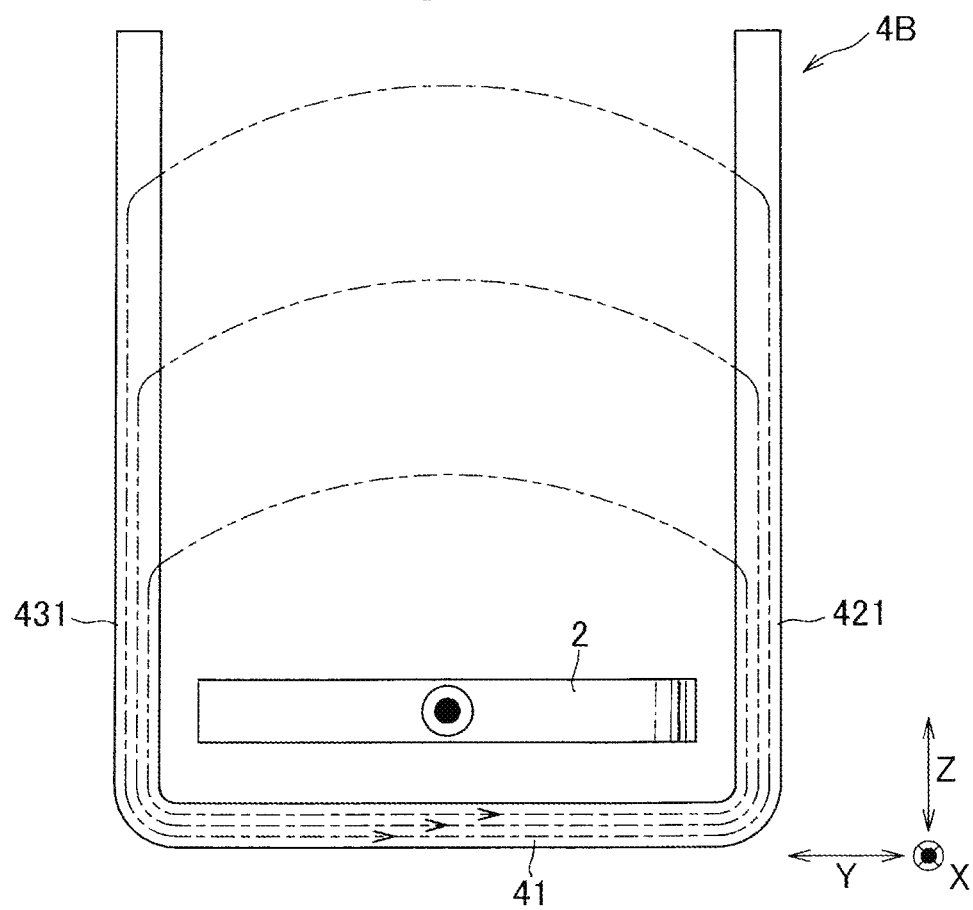
FIG. 7 is a front view illustrating a magnetic flux passing through an opened portion of the magnetic permeable member.
Figure 8:
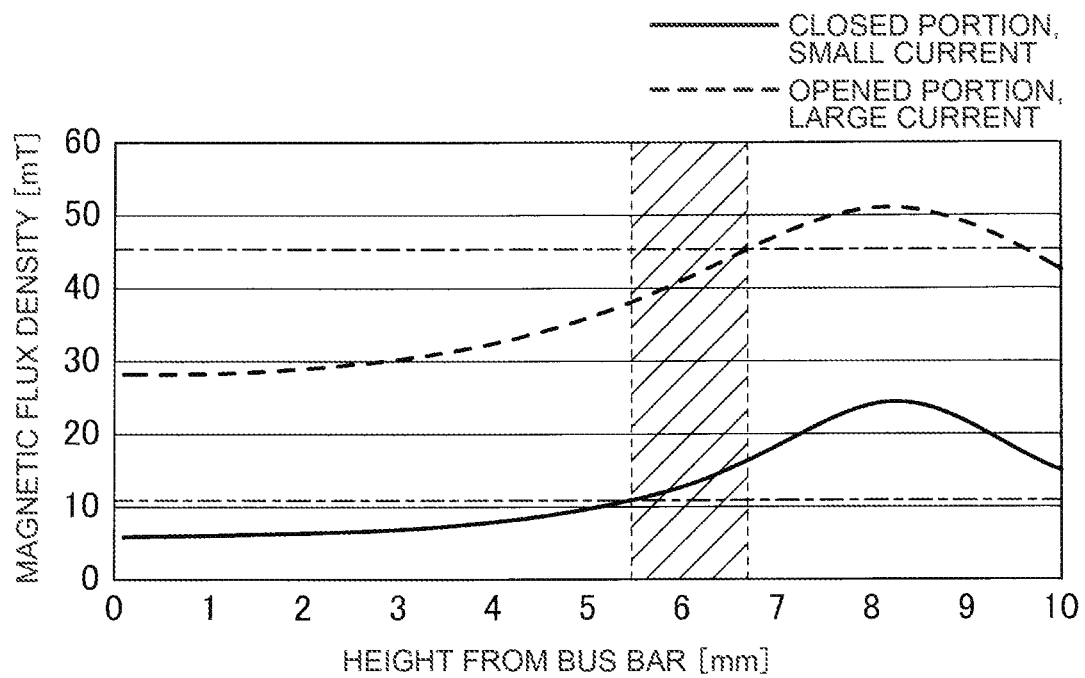
FIG. 8 is a graph showing a positional dependency of a magnetic flux density in the magnetic permeable member.

The following will explain an exemplary embodiment of the present invention in reference to the drawings. FIG. 1 is a perspective view showing a current detection device 1 according to one embodiment of the present invention, FIG. 2 is an exploded perspective view showing the current detection device 1, FIG. 3 is a perspective view showing a magnetic permeable member 4 of the current detection device 1, FIG. 4 is a top view showing a part of the current detection device 1, FIG. 5 is a front view showing a part of the current detection device 1, FIG. 6 is a front view illustrating a magnetic flux passing through a closed portion 4A of the magnetic permeable member 4, FIG. 7 is a front view illustrating a magnetic flux passing through an opened portion 4B of the magnetic permeable member 4, FIG. 8 is a graph showing a positional dependency of a magnetic flux density in the magnetic permeable member 4, and FIG. 9 is a graph showing another positional dependency of a magnetic flux density in the magnetic permeable member 4.

The current detection device 1 of this embodiment is configured to detect a current flowing between a power source and an electric component (e.g., a motor) mounted on a vehicle, and includes a band plate-shaped bus bar 2, a printed board 30 having two magnetic field detection elements 3A, 3B, a magnetic permeable member 4 and a housing 5. The power source and the electric component are electrically connected to each other by the bus bar 2 to detect the current flowing through the bus bar 2. In this embodiment, a long side direction of the bus bar 2 is referred to as a X direction, a short side direction of the bus bar 2 is referred to as a Y direction, and a plate thickness direction of the bus bar 2 is referred to as a Z direction. The bus bar 2 and the printed board 30 are arranged to face each other along the Z direction. In the Z direction, a side of the printed board 30 is referred to as an upper side, and a side of the bus bar 2 is referred to as a lower side.

The bus bar 2 is made of a conductive metal such as a copper or an aluminum, and has connecting portions 21, 22 on both ends thereof in its long side direction. The connecting portions 21, 22 are configured to be electrically connected to the power source and the electric component, respectively. The bus bar 2 is arranged to face a later-described bottom plate portion 41 of the magnetic permeable member 4 in the Z direction. Here, the bus bar 2 and the bottom plate portion 41 are arranged spaced from each other for an appropriate distance and are insulated from each other.

The printed board 30 lies along the XY plane and is formed into a rectangular plate shape having a long side direction corresponding to the X direction. Two magnetic field detection elements 3A, 3B are provided on the same plane (an upper face in this embodiment) of the printed board 30, and are arranged side by side with a predetermined interval in the X direction. Alternatively, the two magnetic field detection elements 3A, 3B may be provided on a lower face of the printed board 30.

The magnetic field detection element 3A, 3B is a Hall IC, for example, and it detects the strength of the magnetic field at a location at which it is positioned. That is, the magnetic field detection element detects the strength of the magnetic field using the Hall effect by applying a voltage on a semiconductor under the magnetic field generated due to the current flowing through the bus bar 2. The magnetic field detection elements 3A, 3B have the same performance and are configured capable of detecting the magnetic flux density (i.e., the magnetic field strength) within a predetermined range. The use of the magnetic field detection elements 3A, 3B having the same performance as described above can prevent an increase in the cost due to an increase in the kinds of the components.

The magnetic permeable member 4 is made of a ferromagnetic metal, for example, and its magnetic permeability is higher than other components of the current detection device 1, such that lines of the magnetic flux preferentially passes through the magnetic permeable member 4. The magnetic permeable member 4 is formed by punching and bending one plate-like member, for example, and has the bottom plate portion 41, a pair of standing wall portions 42, 43 and a pair of facing plate portions 44, 45, which are formed integral.

The bottom plate portion 41 is formed into a rectangular plate shape lying in the XY plane and having its long side direction corresponding to the X direction. The bottom plate portion 41 is arranged such that an upper face thereof faces a lower face of the bus bar 2. The pair of standing wall portions 42, 43 is formed continuously with the both ends of the bottom plate portion 41 in the Y direction, respectively, and extends upward in the Z direction. That is, the pair of standing wall portions 42, 43 extends along the ZX plane and is positioned on the both ends of the bus bar 2 in the Y direction, respectively.

Each of the standing wall portions 42, 43 includes a high wall portion 421, 431 formed on one side in the X direction (on the side of a later-described connector connection portion 51), a low wall portion 422, 432 formed on the other side, and a cutout portion 423, 433 formed between the high wall portion 421, 431 and the low wall portion 422, 432. The cutout portions 423, 433 prevent interference between the magnetic flux passing through a later-described closed portion 4A and the magnetic flux passing through a later-described opened portion 4B. The cutout portions 423, 433 are shaped such that they are opened upward in the Z direction (i.e., opened on an opposite side of the bottom plate portion 41). The standing wall portions 42, 43 are arranged such that the high wall portions 421, 431 have higher wall height (i.e., have larger size in the Z direction) than the low wall portions 422, 432, while the low wall portions 422, 432 have higher wall height than the cutout portions 423, 433.

In this embodiment, the size in the Z direction of the high wall portion 421, 431 is about 1.5 times the size in the Z direction of the low wall portion 422, 432, and the size in the Z direction of the low wall portion 422, 432 is about 1.5 times the size in the Z direction of the cutout portion 423, 433. However, these sizes in the Z direction can have other sizes as long as they are within an appropriate range. Preferably, the size in the Z direction of the high wall portion 421, 431 is about 1.3-1.7 times the size in the Z direction of the low wall portion 422, 432, and the size in the Z direction of the low wall portion 422, 432 is about 1.3-1.7 times the size in the Z direction of the cutout portion 423, 433.

In this embodiment, the high wall portions 421, 431, the low wall portions 422, 432, and the cutout portions 423, 433 respectively have substantially equal sizes in the X direction. The sizes in the X direction of the high wall portions 421, 431, the low wall portions 422, 432, and the cutout portions 423, 433 can have other sizes as long as they are within an appropriate range, and are preferably within about 20-40%, respectively, with respect to the entire size in the X direction of the standing wall portions 42, 43.

The pair of facing plate portions 44, 45 is continuous with upper ends of the low wall portions 422, 432, respectively, and extends toward each other in the Y direction. That is, the pair of facing plate portions 44, 45 extends along the XY plane and is arranged to face the bottom plate portion 41 in the Z direction with a predetermined interval from the bottom plate portion 41. In this embodiment, tip ends of the pair of facing plate portions 44, 45 are spaced from each other in the Y direction. Further, the facing plate portions 44, 45 are formed into a rectangular plate shape and have chamfered portions 441, 451 each provided at a corner on the tip end side.

In this magnetic permeable member 4, the bottom plate portion 41, the pair of low wall portions 422, 432 and the pair of facing plate portions 44, 45 together form the closed portion 4A having a C-shaped cross section (C-shaped when viewed in the X direction), while the bottom plate portion 41 and the pair of high wall portions 421, 431 together form the opened portion 4B having the U-shaped cross section (U-shaped when viewed in the X direction). The closed portion 4A includes the low wall portions 422, 432, and the opened portion 4B includes the high wall portions 421, 431, thus the wall height of the standing wall portions 42, 43 is higher at the opened portion 4B than at the closed portion 4A. It is noted that the names of "closed portion" and "opened portion" are not used to limit the shape or configuration of the components.

The housing 5 is formed of an insulating synthetic resin and includes the connector connection portion 51, a board housing portion 52, a bus bar holder 53 and a permeable member holder 54. The housing 5 holds the bus bar 2, the printed board 30 and the permeable member 4 such that they are insulated from each other. That is, the relative positions of the bus bar 2, the printed board 30 and the permeable member 4 are maintained by the housing 5.

The connector connection portion 51 is formed into a tubular shape, and when an appropriate connector is connected to this connector connection portion 51, the measurement values of the magnetic field detection elements 3A, 3B are outputted to outside. The board housing portion 52 has a concaved shape opened downward in the Z direction, in which a molding material is filled with the printed board 30 housed in the board housing portion 52, thereby holding the printed board 30.

The bus bar holder 53 includes a rib configured to push the lower face and a side end face of the bus bar 2, and an engagement portion configured to engage with a cutout formed on the side end face of the bus bar 2, to prohibit the bus bar 2 from moving in any of the X direction, the Y direction and the Z direction with respect to the housing 5. The permeable member holder 54 includes a lock arm 541 configured to lock the permeable member 4 at the cutout portions 423, 433, and a sandwiching portion 542 configured to sandwich and push, in the Z direction, the facing plate portions 44, 45, to prohibit the permeable member 4 from moving in any of the X direction, the Y direction and the Z direction with respect to the housing 5. Alternatively, the bus bar holder and the permeable member holder may hold the bus bar and the permeable member by the welding of the resin which forms the housing.

In the following, a detailed positional relationship between the bus bar 2, the printed board 30 and the permeable member 4 is explained in reference to FIG. 4 and FIG. 5. The bus bar 2 and the printed board 30 are arranged between the bottom plate portion 41 and the facing plate portions 44, 45 in the Z direction, i.e., the bus bar 2 and the printed board 30 are passed inside the closed portion 4A. An arrangement height of the bus bar 2 with reference to the bottom plate portion 41 is about 20-40% of the height of the low wall portions 422, 432, whereas an arrangement height of the magnetic field detection elements 3A, 3B of the printed board 30 with reference to the bottom plate portion 41 is about 60-80% of the height of the low wall portions 422, 432.

In the above-described configuration, when the current flows through the bus bar 2 and the magnetic field is generated, the magnetic flux passes through as shown in FIG. 6 and FIG. 7. In the shown example, the current flows through the bus bar 2 in a direction from the back side to the front side with respect to the plane of the paper of the drawing, and the lines of the magnetic flux head to the counterclockwise direction. Since the permeable member 4 has higher permeability than other portions, the magnetic flux preferentially passes through the permeable member 4. In the closed portion 4A, although the tip ends of the facing plate portions 44, 45 are spaced apart from each other, a route passing between these tip ends has lower magnetic resistance compared to other routes. Thus, many lines of the magnetic flux pass along an imaginary closed ring including the C-shaped closed portion 4A. That is, the magnetic flux that passes from one low wall portion 432 through the bottom plate portion 41 to the other low wall portion 422, preferentially passes through the facing plate portions 44, 45 when returning to the one low wall portion 432 again. As a result, the magnetic flux is concentrated.

On the other hand, in the opened portion 4B, the interval between the pair of high wall portions 421, 431 is substantially constant regardless of the position in the Z direction. Thus, for the magnetic flux that passes from one high wall portion 431 through the bottom plate portion 41 and has reached to the other high wall portion 421, there is no preferential route (i.e., the route through which the lines of the magnetic flux preferentially pass) when returning to the one high wall portion 431 again. Thus, the magnetic flux is less likely to be concentrated.

As described above, the magnetic flux is more likely to be concentrated at the closed portion 4A, whereas the magnetic flux is less likely to be concentrated at the opened portion 4B. Consequently, the magnetic field is more likely to be strong inside the closed portion 4A, and the magnetic field is less likely to be strong inside the opened portion 4B. Herein, inside the opened portion 4B is referred to a region surrounded in the three directions by the pair of high wall portions 421, 431 and the bottom plate portion 41.

In the following, a positional dependency of a magnetic flux density measured when the current flew through the bus bar 2 is explained in reference to FIG. 8. In this measurement, for each of the closed portion 4A and the opened portion 4B, a measurement position in the Z direction (i.e., height from the bus bar 2) is varied, while the measurement position is fixed for the X direction and the Y direction. In the drawing, the magnetic flux density at the closed portion 4A measured when a small current I1 flew through the bus bar is shown with a solid line, and the magnetic flux density at the opened portion 4B measured when a large current I2 flew through the bus bar is shown with a dotted line In the closed portion 4A, at the position close to the bus bar 2, the magnetic flux density is more likely to be influenced by the magnetic flux passing through the bottom plate portion 41, and, as the distance from the bus bar 2 is increased, the magnetic flux density is less likely to be influenced by the magnetic flux passing through the bottom plate portion 41 but more likely to be influenced by the magnetic flux passing through the facing plate portions 44, 45. As a result, the magnetic flux density at the closed portion 4A is maximum at the position distant from the bus bar 2 for a predetermined distance.

In case of the magnetic permeable member having only the opened portion and not having the closed portion, the magnetic flux density is decreased as distant from the bus bar (distant from the bottom plate portion). However, since the magnetic permeable member 4 according to this embodiment has both of the closed portion 4A and the opened portion 4B, the magnetic flux density at the opened portion 4B is influenced by the magnetic flux of the closed portion 4A. Thus, a curved line of the magnetic flux density at the opened portion 4B exhibits a tendency similar to a curved line of the magnetic flux density at the closed portion 4A.

The magnetic field detection elements 3A, 3B are configured to be capable of detecting a predetermined range of the magnetic flux density (in this embodiment, 11 through 45 mT, as shown in the drawing with vertical dotted lines). Thus, by setting the position in the Z direction of the magnetic field detection elements 3A, 3B such that both of the magnetic flux density at the closed portion 4A generated when the small current I1 flew and the magnetic flux density at the opened portion 4B generated when the large current I2 flew fall within the above-mentioned range (i.e., in FIG. 8, both of the curved lines fall within the range indicated by the vertical dotted lines), that is, by setting the position in the Z direction of the magnetic field detection elements 3A, 3B to be within the hatched range, the magnetic field strength generated by the small current I1 can be detected by the magnetic field detection element 3A arranged in the closed portion 4A, and the magnetic field strength generated by the large current I2 can be detected by the magnetic field detection element 3B arranged in the opened portion 4B, while arranging the common magnetic field detection elements 3A, 3B on the same plane of the printed board 30.

Next, the X direction positional dependency of the magnetic flux density is explained in reference to FIG. 9. In FIG. 9, the horizontal axis corresponds to "depth", in which ends of the standing wall portions 42, 43 on the other side in the X direction (i.e., the front side along the X direction in FIG. 3) corresponds to "0", and the depth increases towards the one side (i.e., the back side along the X direction in FIG. 3). In the drawing, the magnetic flux density measured when the current flew through the bus bar 2 of the current detection device 1 of this embodiment, is shown with a solid line. Herein, a second embodiment of the present invention provides a current detection device including a magnetic permeable member having a closed portion and an opened portion, but not having a cutout portion. For the current detection device of the second embodiment, the magnetic flux density measured when the current flew through the bus bar is shown with a dotted line.

According to this embodiment, since the cutout portions 423, 433 are formed on the standing wall portions 42, 43 of the magnetic permeable member 4, the magnetic flux passing through the closed portion 4A and the magnetic flux passing through the opened portion 4B are less likely to interfere with each other. Thus, in each of a range corresponding to the closed portion 4A and a range corresponding to the opened portion 4B, the variation in the magnetic flux density with respect to the variation in the depth is small (i.e., an absolute value of a slope in the graph is small).

On the other hand, according to the second embodiment, since the cutout portion is not formed on the standing wall portion of the magnetic permeable member, the magnetic flux passing through the closed portion and the magnetic flux passing through the opened portion are more likely to interfere with each other. Thus, in a range corresponding to the opened portion, the variation in the magnetic flux density with respect to the variation in the depth is large (i.e., an absolute value of a slope in the graph is large).

For the current detection device 1 described above, the relationship between the current flowing through the bus bar 2 and the magnetic field strength (the magnetic flux density) at the position at which each of the magnetic field detection elements 3A, 3B is to be placed, is measured in advance, and this relationship is stored in an appropriate storage unit. Then, the current flowing through the bus bar 2 is detected based on the magnetic field strength detected by the magnetic field detection elements 3A, 3B and the stored relationship between the current and the magnetic field strength.

This embodiment has the following advantageous effects. According to the above-described embodiment, the magnetic permeable member 4 includes the closed portion 4A and the opened portion 4B. Thus, when the large current flows through the bus bar 2, the magnetic field is less likely to be strong at the opened portion 4B, thus the large current is easily detectable by the magnetic field detection element 3B arranged at the opened portion 4B. Further, when the small current flows through the bus bar 2, the magnetic field is more likely to be strong at the closed portion 4A, thus the small current is easily detectable by the magnetic field detection element 3A arranged at the closed portion 4A. Consequently, the magnetic field detection elements 3A, 3B can be commonalized to reduce the cost, while allowing the detection of the current in a wide range.

Moreover, since the standing wall portions 42, 43 include the cutout portions 423, 433 formed between the closed portion 4A and the opened portion 4B, the magnetic fluxes are less likely to interfere with each other, thus the variation of the magnetic flux with respect to the variation in the X direction position can be made small in each of the region corresponding to the closed portion 4A and the region corresponding to the opened portion 4B. Consequently, even if a positional displacement in the X direction between the magnetic permeable member 4 and the magnetic field detection elements 3A, 3B has occurred during the assembling of the current detection device 1, the detected value of the magnetic field is less likely to vary. Thus, the detection error of the current due to the positional displacement can be reduced.

Moreover, since the wall height of the standing wall portions 42, 43 is higher in the opened portion 4B than in the closed portion 4A, the facing areas of the pair of the high wall portions 421, 431 can be increased. In the pair of high wall portions 421, 431, the magnetic flux lines can pass at the facing portions. Thus, the increase in the facing areas can inhibit the concentration of the magnetic flux at the opened portion 4B, allowing the easy detection of the large current.

The present invention is not limited to the embodiment described above. The present invention may include other configurations and such which can achieve the object of the present invention, and may include modifications such as those described below.

For example, in the embodiment described above, the standing wall portions 42, 43 have higher wall height at the opened portion 4B than at the closed portion 4A. However, these wall heights may be set appropriately according to the magnitude or range of the current to be detected, thus, the wall height may be lower at the opened portion than at the closed portion, or the wall heights may be substantially equal at the opened portion and the closed portion. By decreasing the wall height of the opened portion, the magnetic permeability member can be downsized.

Furthermore, in the embodiment described above, the standing wall portions 42, 43 include the cutout portions 423, 433 formed between the closed portion 4A and the opened portion 4B. The width (the X direction size) and the depth (the Z direction size) may be set appropriately. For example, the cutout portion may reach to the bottom plate portion such that the standing wall portion is completely divided by the closed portion and the opened portion. Alternatively, if the magnetic field detection element and the magnetic permeable member are less likely to be displaced in the X direction, the cutout portion can be omitted.

Furthermore, in the embodiment described above, the tip ends of the pair of facing plate portions 44, 45 are spaced from each other in the Y direction to form the closed portion 4A with the C-shaped cross section. The size of the space between the tip ends of the pair of facing plate portions may be set appropriately according to the magnitude or range of the current to be detected. The size of the space between the tip ends of the pair of facing plate portions may be set 0 to allow the tip ends to abut on each other to form the closed portion with the O-shaped cross section.

Furthermore, in the embodiment described above, the two magnetic field detection elements 3A, 3B are arranged on the same plane of one printed board 30. However, the two magnetic field detection elements may be arranged on different planes respectively, or the two magnetic field detection elements may be arranged on two printed boards respectively. In case of arranging the two magnetic field detection elements on the different printed boards, the Z direction position of these printed boards may be the same or different.

Furthermore, in the embodiment described above, the two magnetic field detection elements 3A, 3B are arranged at the closed portion 4A and the opened portion 4B, respectively. However, the magnetic field detection elements may be arranged on the boundary portion between the closed portion 4A and the opened portion 4B (i.e., the region where the cutout portions 423, 433 are formed). Furthermore, more than two magnetic field detection elements may be arranged at appropriate positions, respectively.

The preferred constitution and method for implementing the present invention have been disclosed herein, however the present invention is not limited to these. That is, although the present invention is shown and explained with reference to some particular embodiments, a skilled person in the art will understand that various modifications related to shape, material, number and other detailed constitutions may be applied to the embodiments described herein without departing from the range of technical idea and the object of the present invention. Therefore, since those descriptions specifying the shape, material and such disclosed herein are described by way of examples to facilitate the understanding of the present invention and do not limit the present invention, the descriptions of members using names without a part or entire of such limitations of shape, material and such are within the present invention.

LIST OF REFERENCE SIGNS

1 current detection device
2 bus bar
3A, 3B magnetic field detection element
4 magnetic permeable member
41 bottom plate portion
42, 43 standing wall portion
423, 433 cutout portion
44, 45 facing plate portion
4A closed portion
4B opened portion

What is claimed is:

1. A magnetic permeable member configured to be provided to a current detection device having a band plate-shaped bus bar and a plurality of magnetic field detection elements for detecting magnetic field generated by a current flowing through the bus bar,
the magnetic permeable member comprising:
a bottom plate portion arranged to face the bus bar;
a pair of standing wall portions standing from the bottom plate portion and positioned on both widthwise sides of the bus bar, the pair of standing wall portions having opposing first standing wall portions and opposing second standing wall portions offset from each other in a lengthwise direction of the bus bar; and
a pair of facing plate portions extending toward each other, each of the pair of facing plate portions extending from an upper end of each of the first standing wall portions so as to face the bottom plate portion,
wherein the bottom plate portion, the pair first standing wall portions and the pair of facing plate portions together constitute a closed portion having a C-shaped or O-shaped cross section, and the bottom plate portion and the second standing wall portions together constitute an opened portion having a U-shaped cross section, and the closed portion and the opened portion are arranged side by side along the lengthwise direction and are configured to respectively hold the magnetic field detection elements therein.

2. The magnetic permeable member according to claim 1, wherein a space is provided between the first standing wall portions and the second standing wall portions so as to be located between the closed portion and the opened portion.

3. A current detection device comprising:
a band plate-shaped bus bar;
a plurality of magnetic field detection elements for detecting magnetic field generated by a current flowing through the bus bar; and
the magnetic permeable member according to claim 2.

4. The magnetic permeable member according to claim 1, wherein a height of the second standing wall portions is higher than the height of the first standing wall portions.

5. The magnetic permeable member according to claim 2, wherein a height of the second standing wall portions is higher than the height of the first standing wall portions.

6. A current detection device comprising:
a band plate-shaped bus bar;
a plurality of magnetic field detection elements for detecting magnetic field generated by a current flowing through the bus bar; and
the magnetic permeable member according to claim 5.

7. A current detection device comprising:
a band plate-shaped bus bar;
a plurality of magnetic field detection elements for detecting magnetic field generated by a current flowing through the bus bar; and
the magnetic permeable member according to claim 1.

8. A current detection device comprising:
a band plate-shaped bus bar;
a plurality of magnetic field detection elements for detecting magnetic field generated by a current flowing through the bus bar; and
the magnetic permeable member according to claim 4.

* * * * *